(12) United States Patent
Nomura et al.

(10) Patent No.: US 12,048,209 B2
(45) Date of Patent: Jul. 23, 2024

(54) DISPLAY DEVICE

(71) Applicant: SHARP KABUSHIKI KAISHA, Sakai (JP)

(72) Inventors: Akira Nomura, Sakai (JP); Taketoshi Nakano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 578 days.

(21) Appl. No.: 17/280,167

(22) PCT Filed: Sep. 26, 2018

(86) PCT No.: PCT/JP2018/035804
§ 371 (c)(1),
(2) Date: Mar. 25, 2021

(87) PCT Pub. No.: WO2020/065796
PCT Pub. Date: Apr. 2, 2020

(65) Prior Publication Data
US 2021/0351264 A1   Nov. 11, 2021

(51) Int. Cl.
*H01L 33/36* (2010.01)
*H10K 59/122* (2023.01)
*H10K 59/131* (2023.01)

(52) U.S. Cl.
CPC ......... *H10K 59/131* (2023.02); *H10K 59/122* (2023.02)

(58) Field of Classification Search
CPC ............... H10K 59/131; H10K 59/122; H10K 59/1315; G09F 9/30; H05B 33/12; H05B 33/22
See application file for complete search history.

(56) References Cited

U.S. PATENT DOCUMENTS

| RE42,308 E | 4/2011 | Hirayama |
| RE44,086 E | 3/2013 | Hirayama |
| 2004/0108977 A1 | 6/2004 | Hirayama |
| 2005/0236970 A1* | 10/2005 | Matsudate ........... H10K 59/122 313/500 |
| 2006/0123293 A1* | 6/2006 | Kim ..................... G09G 3/3291 714/724 |
| 2007/0096135 A1 | 5/2007 | Matsumoto |
| 2009/0115952 A1* | 5/2009 | Nakamura ............. G02B 5/201 349/143 |
| 2010/0188391 A1* | 7/2010 | Kim ..................... G09G 3/3233 345/212 |
| 2013/0033667 A1 | 2/2013 | Yanagisawa et al. |

(Continued)

FOREIGN PATENT DOCUMENTS

| JP | H07175076 A | 7/1995 |
| JP | 2001083934 A | 3/2001 |

(Continued)

*Primary Examiner* — Samuel Park
(74) *Attorney, Agent, or Firm* — ScienBiziP, P.C.

(57) ABSTRACT

A high-level power source line of a display device has a resistance value per unit length that is greater from a second end portion side toward a first end portion side in at least a portion of a section ranging from the first end portion connected to a first power source bus line to the second end portion in a side opposite to the first end portion. Accordingly, variation in luminance of each pixel is suppressed.

16 Claims, 8 Drawing Sheets

(56) References Cited

U.S. PATENT DOCUMENTS

| | | | |
|---|---|---|---|
| 2015/0348465 A1* | 12/2015 | Sung | G09G 3/3233 345/77 |
| 2015/0372072 A1 | 12/2015 | Xiong et al. | |
| 2016/0260932 A1* | 9/2016 | Seo | H10K 59/35 |

FOREIGN PATENT DOCUMENTS

| JP | 2004206056 A | 7/2004 |
|---|---|---|
| JP | 2007128049 A | 5/2007 |
| JP | 2013037049 A | 2/2013 |

\* cited by examiner

DISPLAY DEVICE

TECHNICAL FIELD

The disclosure relates to a display device.

BACKGROUND ART

In an electroluminescence (EL) panel of PTL 1, a plurality of scanning electrodes connected to a scan driver IC and a plurality of drive electrodes connected to a driver IC intersect each other. Then, wiring line resistance of each of the drive electrodes is relatively great in a side close to the scan driver IC, and is relatively small in a side far from the scan driver IC.

According to PTL 1, accordingly, it is considered that rounding of a rectangle wave of an output voltage of the driver IC that occurs due to wiring line resistance of the scanning electrodes connected to the scan driver IC can be suppressed.

CITATION LIST

Patent Literature

PTL 1: JP 2001-83934 A

SUMMARY

Technical Problem

In each of various display devices such as the display device, in addition to a scan driver IC and a driver IC, a power source circuit that supplies a constant voltage for generating a voltage according to a gray scale of each pixel is also disposed. A plurality of power source lines are connected to the power source circuit, and each power source line extends in a direction away from the power source circuit.

Then, a voltage is adjusted for each pixel from a constant voltage supplied to each power source line, and such an adjusted voltage is supplied to each pixel electrode.

In a display device 101 illustrated in FIG. 8, a driver 102 where a power source circuit for supplying a constant voltage to each pixel is installed is disposed adjacent to a display region 105 including pixels disposed in a matrix shape. In the display region 105, although not illustrated, each power source line that includes one end portion connected to the driver 102 and that extends in a direction away from the driver 102 toward the other end portion is disposed.

The area of a light-emitting layer that is provided in each pixel and that emits light by a voltage applied from a pixel electrode is constant from a side close to the driver 102 to a side far from the driver 102. In addition, the width of each power source line is constant from the side close to the driver 102 to the side far from the driver 102. Then, in each power source line, due to addition of wiring line resistance, a resistance value at or near the side far from the driver 102 becomes greater than a resistance value at or near the side close to the driver 102, and a voltage value supplied to the pixel electrode becomes small. As a result, luminance of a pixel becomes dark in a region Z in the side far from the driver 102 in the display region 105. As a result, variation in luminance occurs in the display region 105 as a whole.

In PTL 1, the wiring line resistance of the power source line is not considered. The disclosure has been made in view of the above-described conventional problems, and an object of the disclosure is to obtain a display device having suppressed variation in luminance of each pixel.

Solution to Problem

To solve the above-described problems, a display device according to an aspect of the disclosure is a display device including a display region where pixels are arrayed, the pixels each including an electro-optical element including a first electrode and a second electrode that are a pair of electrodes, the display device including a power source circuit that is a supply source of a voltage supplied to each of the first electrodes, a first power source bus line connected to the power source circuit and supplied with a constant voltage from the power source circuit and extending along an edge of the display region. a second power source bus line disposed to face the first power source bus line via the display region, and a plurality of power source lines branched from the first power source bus line toward the display region and connected to the second power source bus line, wherein each of the plurality of power source lines includes a first end portion that is an end portion in a side supplied with the constant voltage from the power source circuit, and a second end portion that is an end portion in a side opposite to the first end portion, and each of the plurality of power source lines has a resistance value per unit length that is greater from the second end portion side toward the first end portion side in at least a portion of a section ranging from the first end portion to the second end portion.

To solve the above-described problems, a display device according to an aspect of the disclosure is a display device including a display region where pixels are arrayed, the pixels each including an electro-optical element including a first electrode and a second electrode that are a pair of electrodes, wherein the first electrode is provided for each of the pixels and the second electrode is provided in common to a plurality of the pixels, the electro-optical element further includes a light-emitting layer provided for each of the pixels between the first electrode and the second electrode, an edge cover configured to cover an end portion of the first electrode and including an opening exposing the first electrode is further provided in an upper layer of the first electrode, and the display device includes a power source circuit that is a supply source of a voltage supplied to each of the first electrodes, a power source line connected to the power source circuit and supplied with a constant voltage from the power source circuit, and a pixel circuit disposed in each of the pixels, and including the electro-optical element, the first electrode and the second electrode, the pixel circuit supplied with the constant voltage from the power source line and configured to control a signal given to the first electrode, each of the power source lines extends along each of the pixels aligned in a row direction or a column direction, and includes a first end portion that is an end portion in a side supplied with the constant voltage from the power source circuit, and a second end portion that is an end portion in a side opposite to the first end portion, among the pixels aligned adjacent to at least a portion of a section ranging from the first end portion to the second end portion in each of the power source lines, area of the opening included in the pixel in the second end portion side is greater than area of the opening included in the pixel in the first end portion side, and the light-emitting layer included in the pixel in the second end portion side and the light-emitting layer included in the pixel in the first end portion side have the same shape and the same size.

Advantageous Effects of Disclosure

According to an aspect of the disclosure, a display device having suppressed variation in luminance of each pixel can be obtained.

DESCRIPTION OF EMBODIMENTS

FIRST EMBODIMENT

Hereinafter, the "same layer" means that a layer is formed by the same process, a "lower layer" means that a layer is formed in a process prior to a process where a layer for comparison is formed, and an "upper layer" means that a layer is formed in a process subsequent to a process where a layer for comparison is formed.

Configuration of Display Device 1

Figure 1:
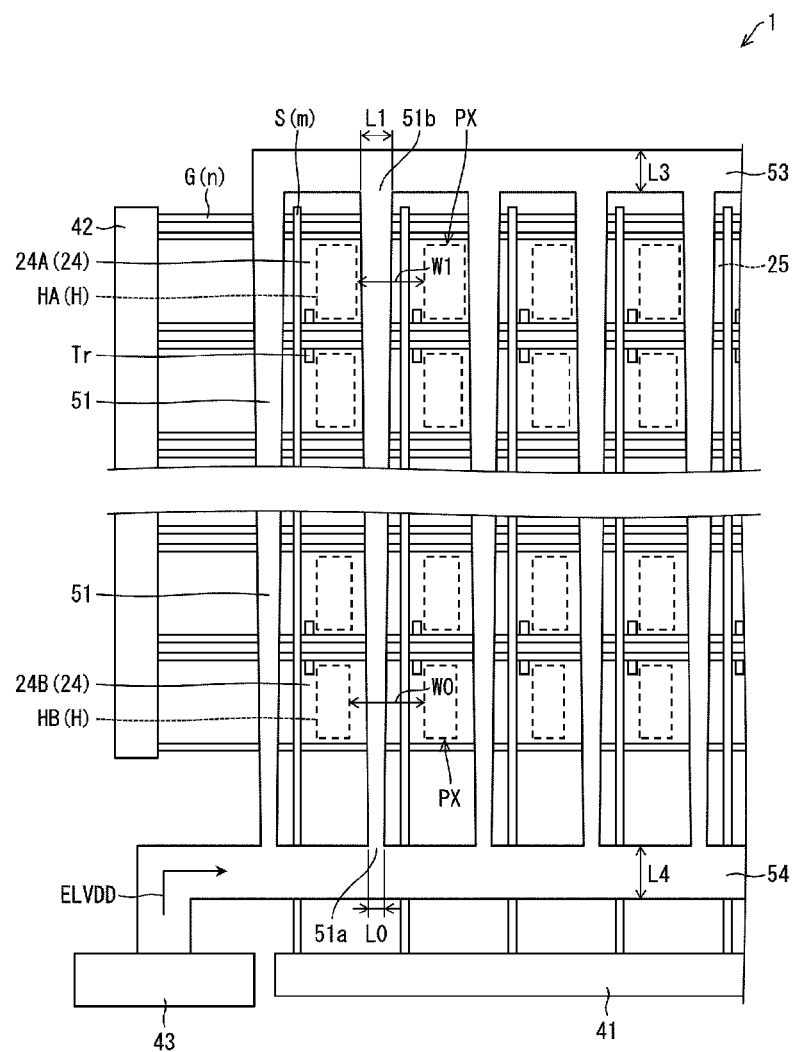
FIG. 1 is a plan view illustrating a configuration of a display device according to a first embodiment of the disclosure.
Figure 2:
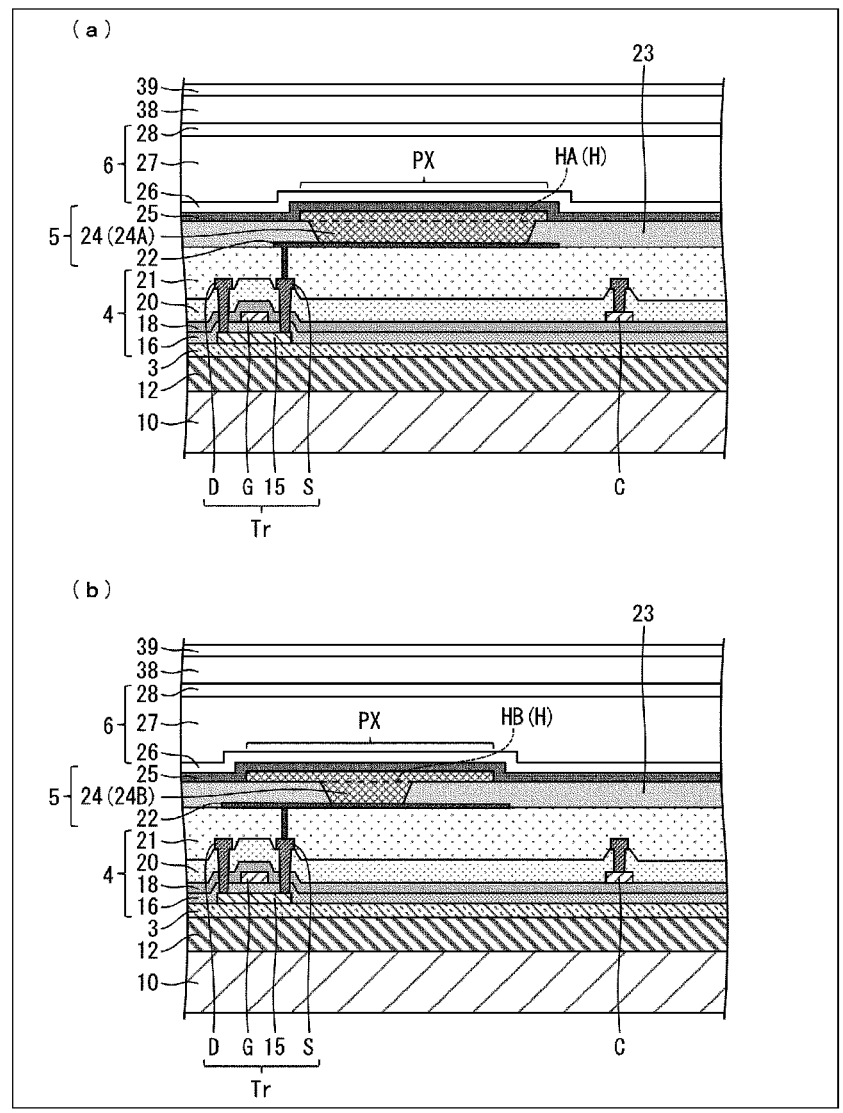
FIG. 2 is a cross-sectional view illustrating a configuration of the display device according to the first embodiment of the disclosure.

FIG. 1 is a plan view illustrating a configuration of a display device 1 according to a first embodiment. FIG. 2 is a cross-sectional view illustrating a configuration of a pixel of the display device 1 according to the first embodiment. (a) of FIG. 2 is a cross-sectional view illustrating a configuration of a pixel in a first power source bus line side, and (b) is a cross-sectional view illustrating a configuration of a pixel in a second power source bus line side.

As illustrated in FIG. 1 and FIG. 2, the display device 1 includes a display region where a plurality of pixels PX for displaying an image are arrayed. Further, the display device 1 includes a frame region that is an edge region surrounding the display region and including no pixel PX disposed.

Cross-sectional Configuration of Display Device 1

As illustrated in FIG. 2, the display device 1 according to the present embodiment is a top-emitting type device that emits light upward, and includes, in order from a lower side, a base material 10, a resin layer 12, a barrier layer 3 (a base coat layer), a TFT layer 4, a light-emitting element layer 5, a sealing layer 6, an adhesive layer 38, and a function film 39.

Examples of a material of the resin layer 12 include polyimide, epoxy, and polyamide. Examples of a material of the base material 10 include polyethylene terephthalate (PET).

The barrier layer 3 is a layer that prevents moisture or an impurity from entering the TFT layer 4 or the light-emitting element layer 5 when the display device is used, and the barrier layer 3 can include, for example, a silicon oxide film, a silicon nitride film, or a silicon oxynitride film that is formed by chemical vapor deposition (CVD), or a layered film of these films.

The TFT layer 4 includes a semiconductor film 15, an inorganic insulating film 16 formed in an upper layer of the semiconductor film 15, a gate electrode G formed in an upper layer of the inorganic insulating film 16, an inorganic insulating film 18 formed in an upper layer of the gate electrode G, a capacitance electrode C formed in an upper layer of the inorganic insulating film 18, an inorganic insulating film 20 formed in an upper layer of the capacitance electrode C, a source electrode S and a drain electrode D both formed in an upper layer of the inorganic insulating film 20, and a flattening film 21 formed in an upper layer of the source electrode S and the drain electrode D.

A transistor Tr (a light emission control transistor) is constituted to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 includes, for example, low-temperature polysilicon (LTPS) or an oxide semiconductor. In FIG. 2, a TFT where the semiconductor film 15 is a channel is illustrated with a top gate structure.

Each of the inorganic insulating films 16, 18, and 20 can include, for example, a silicon oxide (SiOx) film or a silicon nitride (SiNx) film that is formed by CVD, or a layered film of these films. The flattening film (interlayer insulating film) 21 can include, for example, a coatable photosensitive organic material such as polyimide and acrylic.

The gate electrode G, the source electrode S, the drain electrode D, and terminals each include, for example, a metal single layer film or a layered film including at least one of aluminum (Al), tungsten (W), molybdenum (Mo), tantalum (Ta), chromium (Cr), titanium (Ti), and copper (Cu).

The light-emitting element layer 5 (for example, an organic light-emitting diode layer) includes an anode electrode 22 (a first electrode) formed in an upper layer of the flattening film 21, an edge cover 23 that defines a pixel PX in an active area (an area overlapping the light-emitting element layer 5), a light-emitting layer 24 formed in an upper layer of the anode electrode 22, and a cathode electrode 25 (a second electrode) formed in an upper layer of the light-emitting layer 24. An electro-optical element including the anode electrode 22, the light-emitting layer 24, and the cathode electrode 25 constitutes a light-emitting element (for example, an organic light-emitting diode: OLED). In the display device 1, the anode electrode 22 and the cathode electrode 25 are a pair of electrodes, and may be disposed in positional relationship opposite to the positional relationship illustrated in FIG. 2.

The edge cover 23 covers an end portion of the anode electrode 22. An opening H exposing a surface of the anode electrode 22 is formed in the edge cover 23. The light-emitting layer 24 is formed by vapor deposition or an ink-jet method in the opening H that is a region (a light-emitting region) surrounded by the edge cover 23. Inside the opening H, the light-emitting layer 24 and the anode electrode 22 come into contact with each other. Note that the opening H and the light-emitting layer 24 will be described in detail below. In a case where the light-emitting element layer 5 is an organic light-emitting diode (OLED) layer, for example, a hole injection layer, a hole transport layer, the light-emitting layer 24, an electron transport layer, and an electron injection layer are layered in an upper layer of a bottom face of the edge cover 23 (a portion where the anode electrode 22 is exposed). Here, the layers except for the light-emitting layer 24 can be common layers. The light-emitting layer 24 is provided for each pixel PX.

The anode electrode 22 is constituted by, for example, layering of Indium Tin Oxide (ITO) and an alloy including Ag, and has light reflectivity. The anode electrode 22 is provided in an island shape for each pixel PX (described in detail below). The cathode electrode 25 can include a transparent conductive material such as ITO and Indium Zinc Oxide (IZO). The cathode electrode 25 is provided in common to a plurality of the pixels PX. In other words, the cathode electrode 25 is provided continuously across the respective pixels PX.

In a case where the light-emitting element layer 5 is an OLED layer, a positive hole and an electron recombine inside the light-emitting layer 24 by a drive current between the anode electrode 22 and the cathode electrode 25, and an exciton having occurred by the recombination falls into a ground state, and thus light is emitted. Since the cathode electrode 25 is transparent and the anode electrode 22 has light reflectivity, light emitted from the light-emitting layer 24 is emitted upward and top-emitting is realized.

The light-emitting element layer 5 is not only limited to the case where the light-emitting element layer 5 constitutes an OLED element, and may constitute an inorganic light emitting diode or a quantum dot light emitting diode.

The sealing layer 6 is transparent, and includes an inorganic sealing film 26 covering the cathode electrode 25, an organic sealing film 27 formed in an upper layer of the inorganic sealing film 26, and an inorganic sealing film 28 covering the organic sealing film 27. The inorganic sealing films 26 and 28 can include, for example, a silicon oxide film, a silicon nitride film, or a silicon oxynitride film that is formed by CVD using a mask, or a layered film of these films. The organic sealing film 27 is thicker than each of the inorganic sealing films 26 and 28, and is a transparent organic film, and can include a coatable photosensitive organic material such as polyimide and acrylic. For example, after ink including such an organic material is applied by ink-jet onto the inorganic sealing film 26, the ink is cured by UV irradiation. The sealing layer 6 covers the light-emitting element layer 5 and prevents foreign matters such as water and oxygen from infiltrating the light-emitting element layer 5.

The function film 39 includes, for example, an optical compensation function, a touch sensor function, a protection function, or the like.

Schematic Planar Configuration of Display Device 1

As illustrated in FIG. 1, the display device 1 further includes a source driver 41, a gate driver 42, a high-level power source circuit (power source circuit) 43, and a low-level power source circuit (not illustrated), a plurality of source wiring lines S(m), a plurality of gate wiring lines G(n), a plurality of high-level power source lines 51, a first power source bus line 54, a second power source bus line 53, a low-level power source line (not illustrated), and the like.

The source driver 41, the gate driver 42, the high-level power source circuit 43, and the low-level power source circuit are formed outside the display region. The high-level power source circuit 43 is a circuit that supplies a high-level power supply voltage ELVDD that is a constant voltage to each pixel PX. The low-level power source circuit is a circuit that supplies a low-level power supply voltage ELVSS that is a constant voltage and smaller than the high-level power supply voltage ELVDD to each pixel PX.

Each of the source wiring lines S(m) is formed in the same layer as the drain electrode D and the source electrode S of the transistor Tr (FIG. 2), and is connected to the source electrode S. M wiring lines of the source wiring lines S(m) are formed in parallel with each other. Each of the gate wiring lines G(n) is formed in the same layer as the gate electrode G of the transistor Tr (FIG. 2), and is connected to the gate electrode G. N wiring lines of the gate wiring lines G(n) are formed in parallel with each other.

The source wiring lines S(m) and the gate wiring lines G(n) intersect each other. The pixel PX is defined in a region divided by the source wiring line S(m) and the gate wiring line G(n). The source driver 41 is connected to one end portion of the source wiring line S(m), and the gate driver 42 is connected to one end portion of the gate wiring line G(n).

The first power source bus line 54 is connected to the high-level power source circuit 43 and extends from the high-level power source circuit 43 along an edge of the display region. The first power source bus line 54 connects first end portions 51a in the same side among both end portions of the respective high-level power source lines 51. The high-level power supply voltage ELVDD supplied from the high-level power source circuit 43 is supplied to each high-level power source line 51 through the first power source bus line 54. The second power source bus line 53 extends along the edge of the display region in a side opposite to the first power source bus line 54 via the display region. The second power source bus line 53 connects second end portions 51b that are end portions in a side opposite to the first end portions 51a, among both the end portions of the respective high-level power source lines 51. The high-level power supply voltage ELVDD supplied from the high-level power source circuit 43 is supplied to the second power source bus line 53 through the first power source bus line 54 and each high-level power source line 51.

Figure 8:
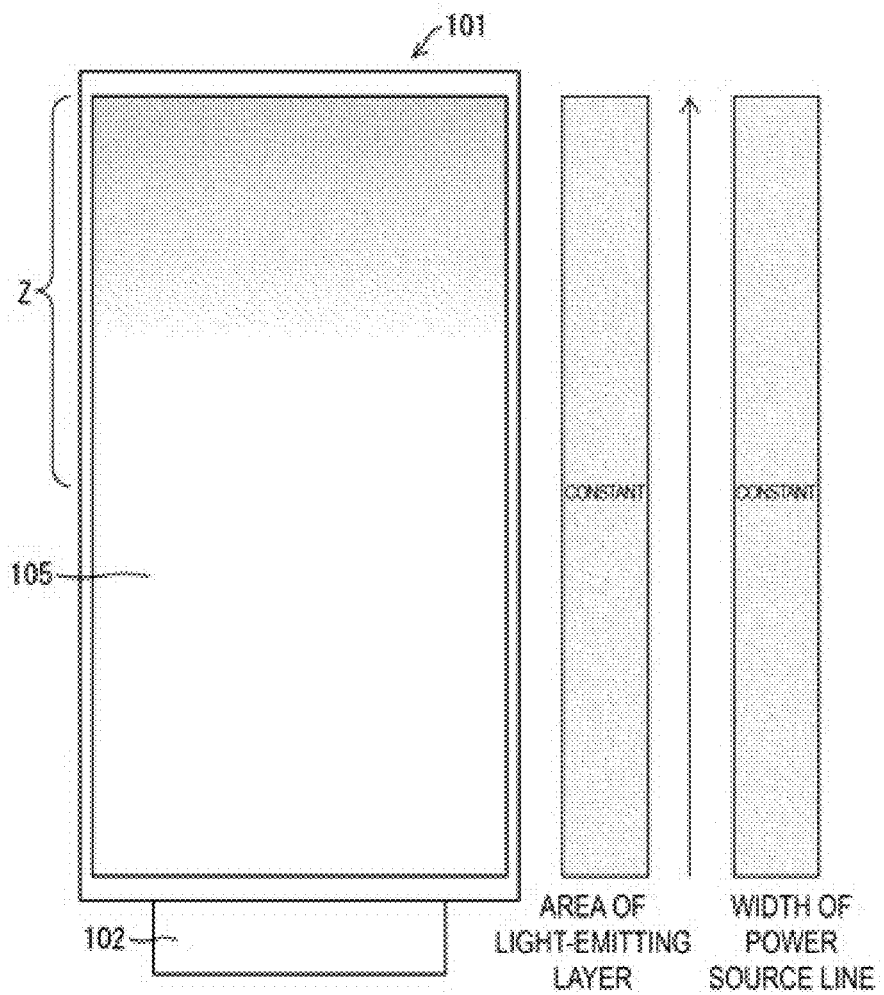
FIG. 8 is a view illustrating a configuration of a conventional display device.

That is, in the present embodiment, among the first power source bus line 54 and the second power source bus line 53, the first power source bus line 54 is a bus line in a side close to a driver (corresponding to the driver 102 illustrated in FIG. 8) provided in the display device 1, and the second power source bus line 53 is a bus line in a side far from the driver (the driver 102 illustrated in FIG. 8).

The high-level power source lines 51 are formed in parallel with the source wiring lines S(m) in the present embodiment. M lines of the high-level power source lines 51 are also formed in parallel with each other. Each high-level power source line 51 is a wiring line for supplying the high-level power supply voltage ELVDD that is a constant voltage to each pixel PX. Each high-level power source line 51 includes the first end portion 51a and the second end portion 51b that are both the end portions.

Each first end portion 51a is connected to the first power source bus line 54, and thus the first end portions 51a adjacent to each other are connected to each other. That is, each first end portion 51a is an end portion in a side close to the first power source bus line 54. Each high-level power source line 51 extends from the first end portion 51a in a direction away from the first power source bus line 54.

Each second end portion 51b is connected to the second power source bus line 53, and thus the second end portions 51b adjacent to each other are connected to each other. Each second end portion 51b is an end portion in a side opposite to the first end portion 51a and is an end portion in a side far from the first power source bus line 54 to which the first end portion 51a is connected. That is, among both the end portions of the high-level power source line 51, the first end portion 51a is an end portion in a side close to a path from the high-level power source circuit 43, and the second end portion 51b is an end portion in a side far from the path from the high-level power source circuit 43.

As described below in detail, in the present embodiment, each high-level power source line 51 has a resistance value in a side close to the first end portion 51a that is greater than a resistance value in a side close to the second end portion 51b, due to narrowing of the width.

In addition, in the opening H of the edge cover 23, area in the side close to the first end portion 51a of each high-level power source line 51 is smaller than area in the side close to the second end portion 51b.

Configuration Example of Pixel Circuit

Figure 3:
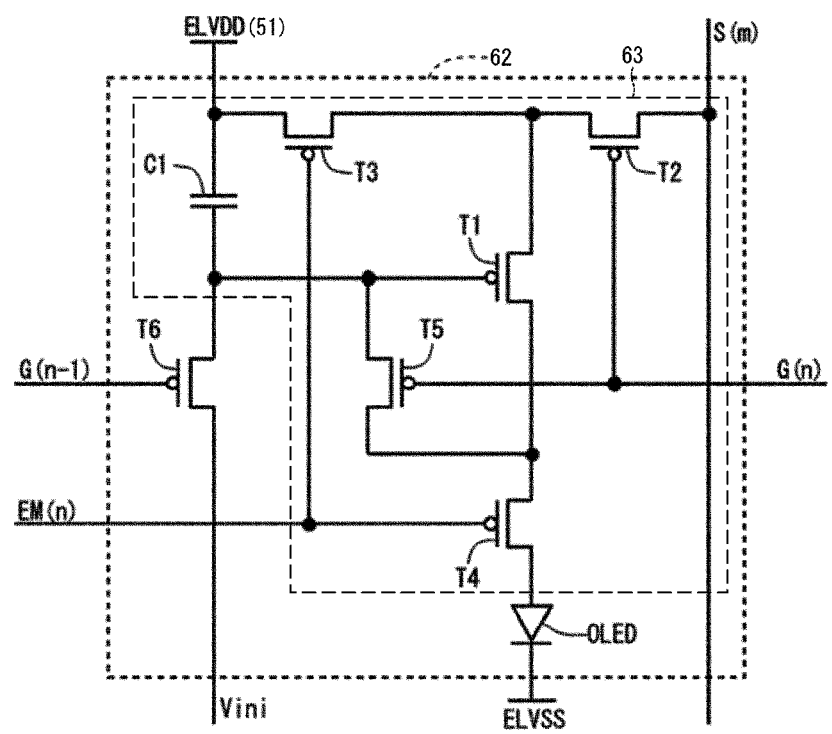
FIG. 3 is a diagram illustrating a configuration of a pixel circuit of the display device according to the first embodiment of the disclosure.

A configuration of a pixel circuit 62 of the display device 1 will be described with reference to FIGS. 1 and 3. FIG. 3 is a diagram illustrating a configuration of the pixel circuit 62 of the display device 1 according to the first embodiment. In FIG. 3, the configuration of the pixel circuit 62 corresponding to an mth column and an nth row is illustrated. Note that the configuration of the pixel circuit 62 described here is an example, and other known configurations can also be employed.

As described above, the plurality of source wiring lines S(m) and the plurality of gate wiring lines G(n) orthogonal to the plurality of source wiring lines S(m) are arranged in the display region of the display device 1. In addition, in the display region, a plurality of light emission control lines EM(n) are arranged in one-to-one correspondence to the plurality of gate wiring lines G(n). Further, in the display region, the pixel circuit 62 is provided in correspondence to each of intersections between the plurality of source wiring lines S(m) and the plurality of gate wiring lines G(n). The pixel circuit 62 is provided in such a manner, and thus the plurality of pixels PX are arrayed in the display region. Note that an organic EL element (electro-optical element) OLED illustrated in FIG. 3 corresponds to the light-emitting element layer 5 illustrated in FIG. 2.

The power source lines common to the respective pixel circuits 62 are formed in the display region. More specifically, the high-level power source line 51 that supplies the high-level power supply voltage ELVDD for driving the organic EL element OLED, the low-level power source line that supplies the low-level power supply voltage ELVSS for driving the organic EL element OLED, and a power source line that supplies an initialization voltage Vini (hereinafter, referred to as an "initialization power source line") are formed. The high-level power supply voltage ELVDD is supplied from the high-level power source circuit 43. The low-level power supply voltage ELVSS and the initialization voltage Vini are supplied from a power source circuit that is not illustrated.

The pixel circuit 62 is supplied with the high-level power supply voltage ELVDD from the high-level power source line 51 and controls a signal given to the light-emitting layer 24 (FIGS. 1 and 2) provided in the organic EL element OLED. The pixel circuit 62 includes one organic EL element OLED, six transistors T1 to T6, and one capacitor C1. The transistors T1 to T6 are p-channel transistors. The capacitor C1 is a capacitance element including the two electrodes (the first electrode and the second electrode). The transistor T1 is a drive transistor. The transistor T2 is a writing control transistor. The transistor T3 is a power source supply control transistor. The transistor T4 is a light emission control transistor. The transistor T5 is a threshold voltage compensation transistor. The transistor T6 is an initialization transistor.

The high-level power source circuit 43 is connected to the capacitor C1 and the transistor T3 via the first power source bus line 54 and the high-level power source line 51.

The organic EL element OLED can be considered to be a diode including the anode electrode 22 (FIG. 2), and the cathode electrode 25 (FIG. 2). A voltage according to an image to be displayed is applied to the anode electrode 22. The cathode electrode 25 is supplied with the low-level power supply voltage ELVSS that is a constant voltage different from the high-level power supply voltage ELVDD.

The anode electrode 22 of the organic EL element OLED is connected to the transistor T4, the transistor T4 is connected to the transistor T5, and the transistor T5 is connected to the capacitor C1.

The source wiring line S(m) is connected to the transistor T2, the transistor T2 is connected to the transistor T3, and the transistor T3 is connected to the high-level power source line 51 and the capacitor C1.

The capacitor C1 and the transistors T1 to T5 constitute a voltage conversion circuit 63. The voltage conversion circuit 63 is connected to the high-level power source line 51 and the anode electrode 22 of the organic EL element OLED. The voltage conversion circuit 63 converts the high-level power supply voltage ELVDD supplied from the high-level power source line 51 to a voltage according to a gray scale level of an image to be displayed (display image), and the converted voltage according to the display image is supplied to the anode electrode 22 of the organic EL element OLED.

When a gate signal is input from a gate wiring line G(n−1), the transistor T6 including a gate electrode connected to the gate wiring line G(n−1) is switched from OFF to ON, and the capacitor C1 is initialized by the initialization voltage Vini supplied to the transistor T6. Then, the transistor T6 is switched from ON to OFF. Accordingly, the high-level power supply voltage ELVDD is supplied from the high-level power source circuit 43 to the capacitor C1 via the high-level power source line 51, and electric charge is accumulated in the capacitor C1. Then, when a light emission control signal is input from each of the light emission control lines EM(n), the transistors T4 and T3 each including a gate electrode connected to the light emission control line EM(n) are switched from OFF to ON.

Then, when a gate signal is input from the gate wiring line G(n), the transistors T5 and T2 each including a gate electrode connected to the gate wiring line G(n) are switched from OFF to ON. Accordingly, a predetermined amount of the electric charge accumulated in the capacitor C1 is extracted to the source wiring line S(m) via the transistors T3 and T2, and due to the rest of the electric charge accumulated in the capacitor C1, a voltage according to a display image that is to be output to the organic EL element OLED is supplied to the organic EL element OLED via the transistors T5 and T4. Accordingly, in the organic EL element OLED, due to a voltage according to a display image supplied to the anode electrode 22, and due to the low-level power supply voltage ELVSS that is a constant voltage supplied to the cathode electrode 25, the light-emitting layer 24 inside the organic EL element OLED emits light.

Detailed Description of High-Level Power Source Line 51, First Power Source Bus Line 54, and Second Power Source Bus Line 53

As illustrated in FIGS. 1 to 3, the display device 1 includes each high-level power source line 51 connected to the high-level power source circuit 43 via the first power source bus line 54, and the pixel circuit 62 disposed in each pixel PX. In each pixel PX, the pixel circuit 62 is supplied with the high-level power supply voltage ELVDD supplied from the high-level power source line 51 and causes the light-emitting layer 24 provided in the organic EL element OLED to emit light with predetermined luminance according to a display image.

Here, among both the end portions of each high-level power source line 51, the first end portion 51a is the end portion connected to the first power source bus line 54 (that is, the end portion in the side close to the first power source bus line 54), and the second end portion 51b in the opposite side is the end portion in the side far from the first power source bus line 54. Each high-level power source line 51 is supplied with the high-level power supply voltage ELVDD that is a constant voltage from the high-level power source circuit 43 via the first power source bus line 54.

Here, in a case where the line width of each high-level power source line is constant, a resistance value in the second end portion 51b where a resistance value due to wiring line resistance is added is greater than a resistance value in the first end portion 51a that is the end portion in a side close to the high-level power source circuit 43. When a resistance value in the second end portion 51b side is great, a voltage supplied from the voltage conversion circuit 63 to the anode electrode 22 provided in the pixel PX at or near the second end portion 51b becomes smaller than a voltage according to a display image, and an amount of light per unit surface area of a light-emitting layer 24A at or near the second end portion 51b is likely to become smaller than an amount of light per unit surface area of a light-emitting layer 24B at or near the first end portion 51a. That is, in a case where the line width of each high-level power source line 51 is constant, in each high-level power source line 51, a voltage at or near the second end portion 51b that is far from the high-level power source circuit 43 is likely to become smaller than a voltage in the first end portion 51a in the side close to the high-level power source circuit 43. Thus, in a case where the line width of the high-level power source line 51 is constant, luminance of the pixel PX at or near the second end portion 51b becomes darker than luminance of the pixel PX at or near the first end portion 51a of the high-level power source line 51.

Then, as illustrated in FIG. 1, in the display device 1 according to the present embodiment, among both the end portions in each high-level power source line 51, a resistance value per unit length at or near the first end portion 51a in a side supplied with the high-level power supply voltage ELVDD is greater than a resistance value per unit length at or near the second end portion 51b in the opposite side. Specifically, when the display region of the display device 1 is viewed from the normal direction, each high-level power source line 51 has area per unit length at or near the first end portion 51a smaller than area per unit length at or near the second end portion 51b. More specifically, when the display region of the display device 1 is viewed from the normal direction, each high-level power source line 51 has a width L0 of the first end portion 51a that is smaller than a width L1 of the second end portion 51b.

Thus, variation in a resistance value can be suppressed from the first end portion 51a to the second end portion 51b in each high-level power source line 51. Accordingly, variation in luminance of the pixel PX at or near the first end portion 51a and luminance of the pixel PX at or near the second end portion 51b in the high-level power source line 51 can be suppressed. As a result, variation in luminance of each pixel PX can be suppressed in the display region as a whole.

Particularly in the present embodiment, in each high-level power source line 51, the width of the high-level power source line 51 is gradually smaller from the second end portion 51b side toward the first end portion 51a side. In other words, each high-level power source line 51 has a resistance value that is gradually greater from the second end portion 51b side toward the first end portion 51a side. Accordingly, in each high-level power source line 51, the high-level power supply voltage ELVDD can be supplied stably from the high-level power source circuit 43 from the first end portion 51a to the second end portion 51b.

In addition, a width L4 of the first power source bus line 54 is greater than a width L3 of the second power source bus line 53. In this way, among the first power source bus line 54 and the second power source bus line 53, the width L4 of the first power source bus line 54 in the side close to the high-level power source circuit 43 is greater, and thus the high-level power supply voltage ELVDD can be supplied stably to each high-level power source line 51.

Further, the width L3 of the second power source bus line 53 is greater than the greatest width L1 of each high-level power source line 51. Accordingly, the high-level power supply voltage ELVDD can also be supplied stably between the second end portions 51b of the respective high-level power source lines 51.

The second power source bus line 53 functions to constantly maintain potential of each high-level power source line 51 in the second end portion 51b side. Thus, the width L3 of the second power source bus line 53 is preferably as great as possible, but it is not necessary to increase the width L3 as great as the width L4 of the first power source bus line 54. Then, the width L3 of the second power source bus line 53 is smaller than the width L4 of the first power source bus line 54, and thus frame narrowing of the display device 1 can be performed.

That is, in the display device 1, the respective line widths of the high-level power source line 51, the second power source bus line 53, and the first power source bus line 54 are set to satisfy the width L0<the width L1<the width L3<the width L4.

Note that each high-level power source line 51 may have a resistance value per unit length that is greater from the second end portion 51b side toward the first end portion 51a side in at least a portion of a section ranging from the first end portion 51a to the second end portion 51b. Specifically, in the at least a portion of a section ranging from the first end portion 51a to the second end portion 51b, each high-level power source line 51 may have area per unit length in a section in the first end portion 51a side that is smaller than area per unit length in a section in the second end portion 51b side. More specifically, when the display region of the display device 1 is viewed from the normal direction, each high-level power source line 51 may have the width in the section in the first end portion 51a side that is smaller than the width in the section in the second end portion 51b side in the at least a portion of a section ranging from the first end portion 51*a* to the second end portion 51*b*.

Accordingly, in each high-level power source line 51, a resistance value in the first end portion 51*a* side that is the side supplied with the high-level power supply voltage ELVDD can be increased, and thus the pixel circuit 62 can cause the light-emitting layer 24 to stably emit light with luminance according to a display image.

Particularly, in each high-level power source line 51, the width of the high-level power source line 51 may be greater gradually from the first end portion 51*a* side toward the second end portion 51*b* side in the at least a portion of a section ranging from the first end portion 51*a* to the second end portion 51*b*. Accordingly, in each high-level power source line 51 including the at least a portion of a section, a resistance value at or near the second end portion 51*b* where a resistance value increases due to wiring line resistance can be reduced sufficiently. Accordingly, in each high-level power source line 51, the high-level power supply voltage ELVDD can be supplied stably from the high-level power source circuit 43 from the first end portion 51*a* to the second end portion 51*b*.

Note that even in a case where a display device other than the organic EL display device according to the present embodiment, for example, an inorganic EL display device or a liquid crystal display device is used, the high-level power source line 51 may be a wiring line for supplying a voltage or a current from a power source circuit to a pixel electrode disposed for each pixel.

In addition, in a case where the display device 1 is constituted as a liquid crystal display device instead of an organic EL display device, an electro-optical element includes a pixel electrode, a counter electrode, and a liquid crystal layer sandwiched between the pixel electrode and the counter electrode. In the liquid crystal layer sandwiched between the pixel electrode and the counter electrode transmittance of light transmission from a backlight is controlled by a potential difference between the pixel electrode and the counter electrode.

Detailed Description of Light-Emitting Layer 24 and Opening H

Figure 4:
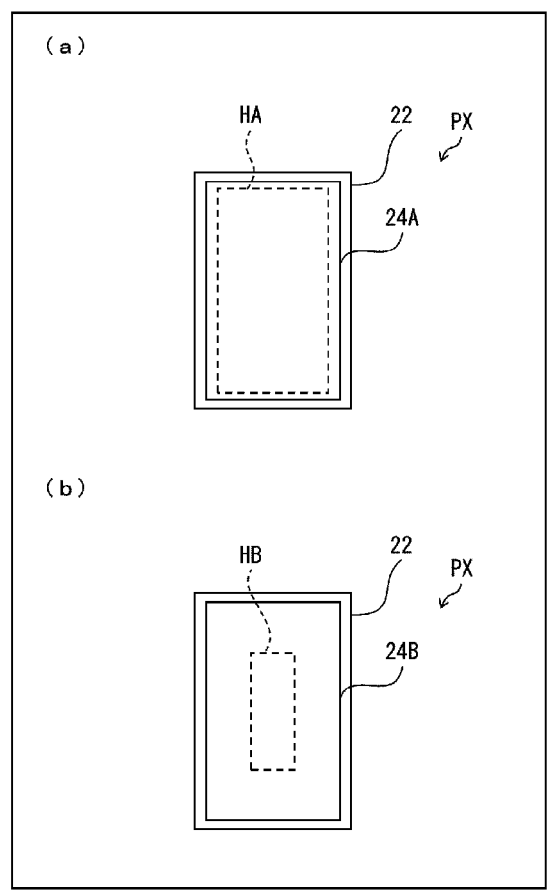
FIG. 4 is a plan view of a pixel in the display device according to the first embodiment of the disclosure.

FIG. 4 is a plan view illustrating a configuration of the pixel PX according to the first embodiment. (a) of FIG. 4 illustrates the configuration of the pixel PX at or near the second end portion 51*b* of the high-level power source line 51, and (b) of FIG. 4 illustrates a structure of the pixel PX at or near the first end portion 51*a* of the high-level power source line 51.

As illustrated in FIG. 1, FIG. 2, and FIG. 4, in the display device 1, among the openings H aligned along each high-level power source line 51, area of an opening HA that is the opening H at or near the second end portion 51*b* is greater than area of an opening HB that is the opening H at or near the first end portion 51*a*.

The light-emitting layer 24 is provided in an upper layer of the edge cover 23. The light-emitting layer 24 is formed and completely fills at least the opening H. The light-emitting layer 24 may also be provided on the edge cover 23 along an edge of the opening H. Area of the light-emitting layer 24 is greater than the area of the opening H. The range where the light-emitting layer 24 overlaps the opening H contributes to display of the pixels in the display region. That is, a region where the light-emitting layer 24 is in contact with the anode electrode 22 inside the opening H mainly emits light. Note that, among the light-emitting layers 24, the light-emitting layer 24 provided in the pixel PX provided with the opening HA may be referred to as the light-emitting layer 24A, and the light-emitting layer provided in the pixel PX provided with the opening HB may be referred to as the light-emitting layer 24B.

The area of the opening HA provided in the pixel PX provided with the light-emitting layer 24A is different from the area of the opening HB provided in the pixel PX provided with the light-emitting layer 24B. However, the light-emitting layers 24, that is, the light-emitting layer 24A and the light-emitting layer 24B have the same shape and the same size when the light-emitting layers 24 are viewed from the normal direction of a substrate plane. The "same shape and the same size" means that in a case where a luminescent material of the light-emitting layer 24 is deposited in each pixel PX in the display region by using a mask including a mask pattern having the same shape and the same size, as a result, the light-emitting layer 24 having the same shape and the same size is formed in each pixel PX provided in the display region. Thus, the light-emitting layer 24A and the light-emitting layer 24B need not necessarily have completely the same shape and the same size.

Here, as described above, in a case where the line width of each high-level power source line 51 is constant, in each high-level power source line 51, due to addition of wiring line resistance, a voltage at or near the second end portion 51*b* that is far from the high-level power source circuit 43 is likely to become smaller than a voltage at or near the first end portion 51*a* that is the side close to the high-level power source circuit 43. Thus, in a case where the line width of the high-level power source line 51 is constant, luminance of the light-emitting layer 24A at or near the second end portion 51*b* of the high-level power source line 51 is darker than luminance of the light-emitting layer 24B at or near the first end portion 51*a* of the high-level power source line 51.

Then, as described above, in the display device 1, among the openings H aligned along each high-level power source line 51, the area of the opening HA at or near the second end portion 51*b* is greater than the area of the opening HB at or near the first end portion 51*a*. In other words, as for the distance between the openings H adjacent to each other across the high-level power source line 51, a distance W0 between the openings HB and HB is greater than a distance W1 between the openings HA and HA.

Thus, a difference in luminance between the light-emitting layer 24B at or near the second end portion 51*b* and the light-emitting layer 24A at or near the first end portion 51*a* can be suppressed. As a result, variation in luminance of each pixel PX can be suppressed in the display region as a whole.

In the display device 1, since the area is gradually greater from the opening HB toward the opening HA, variation in luminance of each pixel PX can be suppressed in the display region of the display device 1 as a whole.

SECOND EMBODIMENT

A second embodiment of the disclosure will be described below. Note that, for convenience of description, a member having the same function as the function of the member described in the first embodiment is denoted by the same reference sign, and description of such a member will be omitted.

Figure 5:
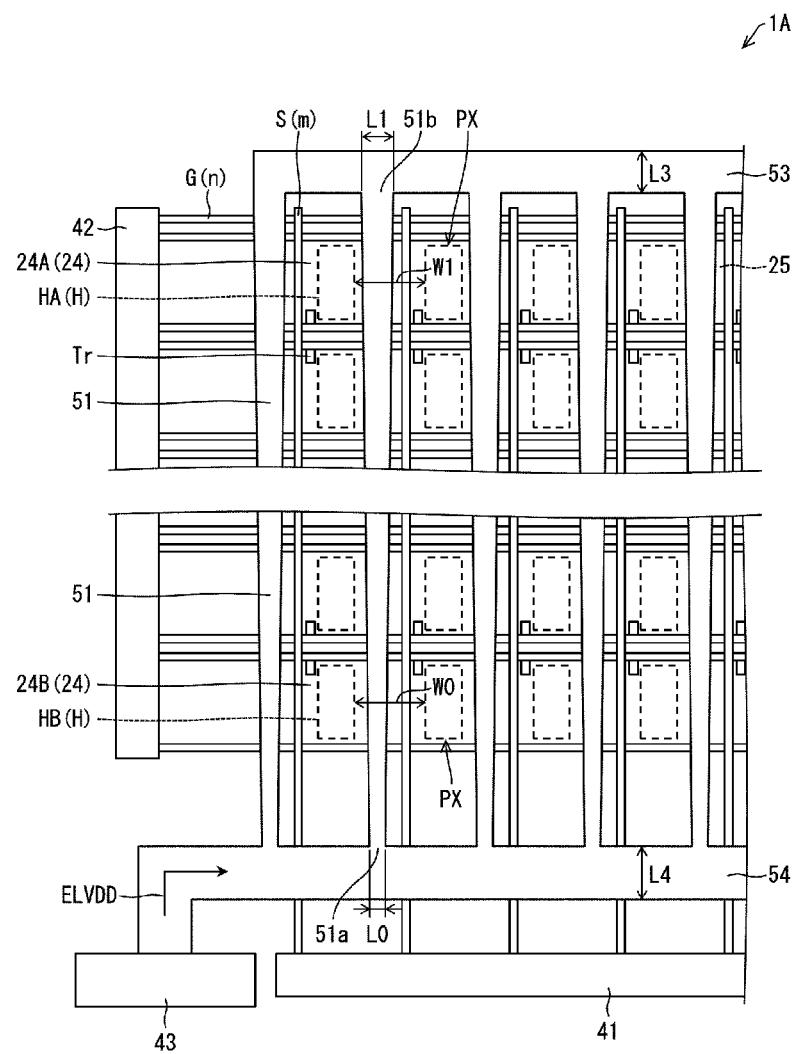
FIG. 5 is a plan view illustrating a configuration of a display device according to a second embodiment of the disclosure.

FIG. 5 is a plan view illustrating a configuration of a display device 1A according to a second embodiment of the disclosure. The display device 1A includes a configuration where in the display device 1 (FIG. 1 or the like), area is the same from the opening HA toward the opening HB aligned along the high-level power source line 51. That is, the openings H have the same area entirely in a display region.

A distance W1 between the openings HA and HA adjacent to each other across the high-level power source line 51 is the same as a distance W0 between the openings HB and HB. That is, the distance between the openings H and H adjacent to each other across the high-level power source line 51 is the same entirely in the display region.

Each high-level power source line 51 has a width L1 at or near a second end portion 51b that is greater than a width L0 at or near a first end portion 51a. Further, each high-level power source line 51 has the width that is gradually greater from the first end portion 51a toward the second end portion 51b. In other words, each high-level power source line 51 has a resistance value that is gradually smaller from the first end portion 51a toward the second end portion 51b. Similarly, in such a display device 1A, variation in luminance of each pixel PX can be suppressed in the display region as a whole.

THIRD EMBODIMENT

A third embodiment of the disclosure will be described below. Note that, for convenience of description, a member having the same function as the function of the member described in the first and second embodiments is denoted by the same reference sign, and description of such a member will be omitted.

Figure 6:
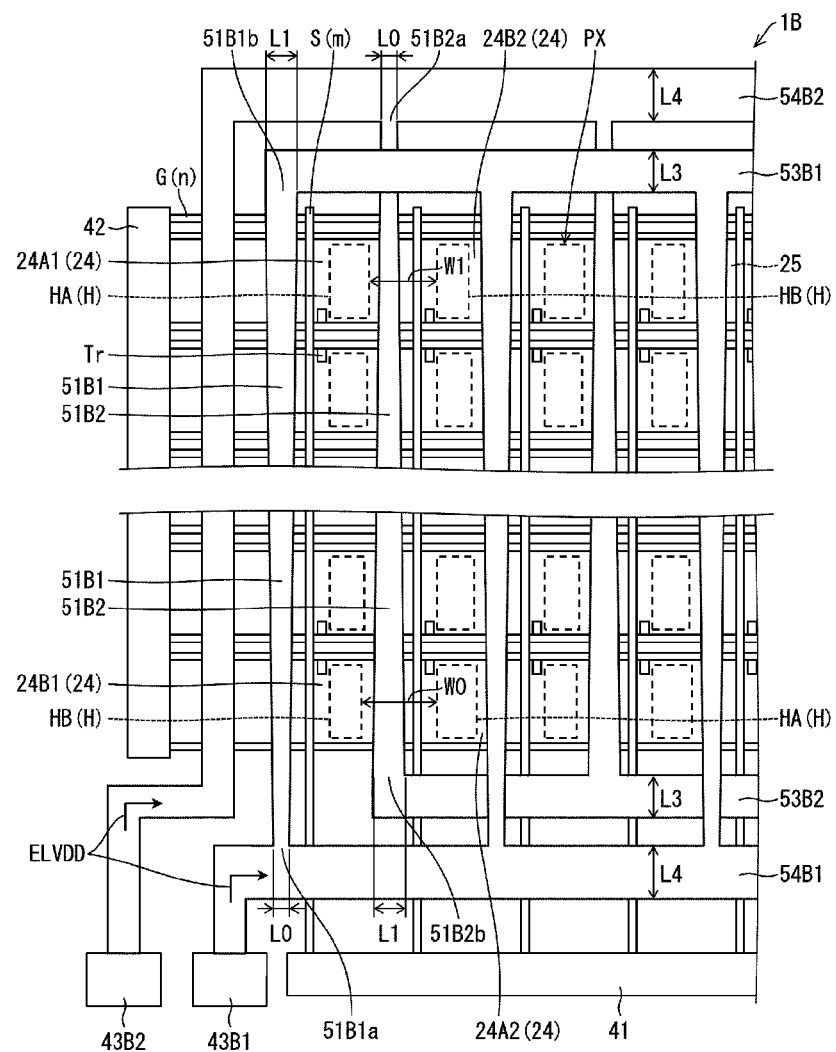
FIG. 6 is a plan view illustrating a configuration of a display device according to a third embodiment of the disclosure.

FIG. 6 is a plan view illustrating a configuration of a display device 1B according to a third embodiment of the disclosure. The display device 1B includes high-level power source lines 51B1 and 51B2, first power source bus lines 54B1 and 54B2, second power source bus lines 53B1 and 53B2, high-level power source circuits 43B1 and 43B2, and light-emitting layers 24A1, 24A2, 24B1 and 24B2, instead of the high-level power source line 51, the first power source bus line 54, the second power source bus line 53, the high-level power source circuit 43, and the light-emitting layers 24A and 24B of the display device 1 (FIG. 1 or the like). Other configurations of the display device 1B are similar to the configurations of the display device 1.

The first power source bus line 54B1 is connected to the high-level power source circuit 43B1 and extends from the high-level power source circuit 43B1 along an edge of a display region. The first power source bus line 54B1 connects first end portions 51B1a in the same side of the respective high-level power source lines 51B1. A high-level power supply voltage ELVDD supplied from the high-level power source circuit 43B1 is supplied to each high-level power source line 51B1 through the first power source bus line 54B1. The second power source bus line 53B1 extends along the edge of the display region in a side opposite to the first power source bus line 54B1 via the display region. The second power source bus line 53B1 connects second end portions 51B1b that are end portions in a side opposite to the first end portions 51B1a of the respective high-level power source lines 51B1. The high-level power supply voltage ELVDD supplied from the high-level power source circuit 43B1 is supplied to the second power source bus line 53B1 through the first power source bus line 54B1 and each high-level power source line 51B1.

The first power source bus line 54B2 is connected to the high-level power source circuit 43B2, extends from the high-level power source circuit 43B2, and extends along the second power source bus line 53B1. The first power source bus line 54B2 connects first end portions 51B2a in the same side of the respective high-level power source lines 51B2. The high-level power supply voltage ELVDD supplied from the high-level power source circuit 43B2 is supplied to each high-level power source line 51B2 through the first power source bus line 54B2. The second power source bus line 53B2 extends along the first power source bus line 54B1 while facing the edge of the display region in a side opposite to the first power source bus line 54B2 via the display region. The second power source bus line 53B2 connects second end portions 51B2b that are end portions in a side opposite to the first end portions 51B2a of the respective high-level power source lines 51B2. The high-level power supply voltage ELVDD supplied from the high-level power source circuit 43B2 is supplied to the second power source bus line 53B2 through the first power source bus line 54B2 and each high-level power source line 51B2.

The high-level power source line 51B1 and the high-level power source line 51B2 are disposed and aligned alternately. The high-level power source line 51B1 is an odd column of a high-level power source line, and the high-level power source line 51B2 is an even column of a high-level power source line.

Each high-level power source line 51B1 includes the first end portion 51B1a and the second end portion 51B1b that are both end portions. The respective first end portions 51B1a are connected to the first power source bus line 54B1, and thus the respective first end portions 51B1a are connected to each other. That is, each first end portion 51B1a is an end portion in a side close to the first power source bus line 54B1. Each high-level power source line 51B1 extends from the first end portion 51B1a in a direction away from the first power source bus line 54B1.

The respective second end portions 51B1b are connected to the second power source bus line 53B1, and thus the second end portions 51B1b adjacent to each other are connected to each other. Each second end portion 51B1b is an end portion in a side opposite to the first end portion 51B1a, and is an end portion in a side far from the first power source bus line 54B1 to which the first end portion 51B1a is connected. That is, among both the end portions of the high-level power source line 51B1, the first end portion 51B1a is an end portion in a side close to a path from the high-level power source circuit 43B1, and the second end portion 51B1b is an end portion in a side far from the path from the high-level power source circuit 43B1.

Each high-level power source line 51B2 includes the first end portion 51B2a and the second end portion 51B2b that are both end portions. The respective first end portions 51B2a are connected to the first power source bus line 54B2, and thus the respective first end portions 51B2a are connected to each other. That is, each first end portion 51B2a is an end portion in a side close to the first power source bus line 54B2. Each high-level power source line 51B2 extends from the first end portion 51B2a in a direction away from the first power source bus line 54B2.

The respective second end portions 51B2b are connected to the second power source bus line 53B2, and thus the second end portions 51B2b adjacent to each other are connected to each other. Each second end portion 51B2b is an end portion in a side opposite to the first end portion 51B2a and is an end portion in a side far from the first power source bus line 54B2 to which the first end portion 51B2a is connected. That is, among both the end portions of the high-level power source line 51B2, the first end portion 51B2a is an end portion in a side close to a path from the high-level power source circuit 43B2, and the second end portion 51B2b is an end portion in a side far from the path from the high-level power source circuit 43B2.

The width of each high-level power source line 51B1 is gradually greater from a width L0 of the first end portion 51B1a to a width L1 of the second end portion 51B1b. Thus, variation in a resistance value from the first end portion 51B1a to the second end portion 51B1b in each high-level power source line 51B1 can be suppressed. Accordingly, variation in luminance of a pixel PX at or near the first end portion 51B1a and luminance of the pixel PX at or near the second end portion 51B1b in the high-level power source line 51B1 can be suppressed. As a result, variation in luminance of each pixel PX can be suppressed in the display region as a whole.

Further, the width of each high-level power source line 51B2 is gradually greater from a width L0 of the first end portion 51B2a to a width L1 of the second end portion 51B2b. Thus, variation in a resistance value from the first end portion 51B2a to the second end portion 51B2b in each high-level power source line 51B2 can be suppressed. Accordingly, variation in luminance of the pixel PX at or near the first end portion 51B2a and luminance of the pixel PX at or near the second end portion 51B2b in the high-level power source line 51B2 can be suppressed. As a result, variation in luminance of each pixel PX can be suppressed in the display region as a whole.

In other words, the high-level power source line 51B1 and the high-level power source line 51B2 adjacent to each other are formed in a comb-like shape where positions of the first end portions 51B1a and 51B2a and the second end portions 51B1b and 51B2b are reversed. That is, the first end portion 51B1a of the high-level power source line 51B1 and the second end portion 51B2b of the high-level power source line 51B2 are adjacent to each other, and the second end portion 51B1b of the high-level power source line 51B1 and the first end portion 51B2a of the high-level power source line 51B2 are adjacent to each other.

Accordingly, the high-level power supply voltage ELVDD that is a constant voltage at which variation in a voltage value is suppressed is supplied to each pixel PX from both directions of the pixels PX arrayed in the display region.

Accordingly, the high-level power supply voltage ELVDD can be supplied from a plurality of the high-level power source circuits 43B1 and 43B2 to the respective high-level power source lines 51B1 and 51B2. Accordingly, the high-level power supply voltage ELVDD can be supplied stably to the respective high-level power source lines 51B1 and 51B2. In addition, as compared to the case where the high-level power supply voltage ELVDD is supplied from one power source circuit to all high-level power source lines, a size of each of the high-level power source circuits 43B1 and 43B2 can be small. Thus, degree of freedom in positions at which the high-level power source circuits 43B1 and 43B2 are disposed can be increased. In other words, degree of freedom in circuit design can be increased.

In addition, in the display device 1B, among openings H aligned along each high-level power source line 51B1, area of an opening HA that is the opening H at or near the second end portion 51B1b is greater than area of an opening HB that is the opening H at or near the first end portion 51B1a. Note that, among the light-emitting layers 24 aligned along each high-level power source line 51B1, a light-emitting layer provided in the pixel PX provided with the opening HA may be referred to as the light-emitting layer 24A1, and a light-emitting layer provided in the pixel PX provided with the opening HB may be referred to as the light-emitting layer 24B1. In the display device 1B, among the openings H aligned along each high-level power source line 51B1, area of the opening HA at or near the second end portion 51B1b is greater than area of the opening HB at or near the first end portion 51B1a. Thus, a difference between luminance of the light-emitting layer 24A1 at or near the second end portion 51B1b and luminance of the light-emitting layer 24B1 at or near the first end portion 51B1a can be suppressed.

In addition, in the display device 1B, among the openings H aligned along each high-level power source line 51B2, area of the opening HA that is the opening H at or near the second end portion 51B2b is greater than area of the opening HB that is the opening H at or near the first end portion 51B2a. The area is gradually greater from the opening HB to the opening HA. Note that, among the light-emitting layers 24 aligned along each high-level power source line 51B2, a light-emitting layer provided in the pixel PX provided with the opening HA may be referred to as the light-emitting layer 24A2, and a light-emitting layer provided in the pixel PX provided with the opening HB may be referred to as the light-emitting layer 24B2.

In the display device 1B, among the openings H aligned along each high-level power source line 51B2, area of the opening HA at or near the second end portion 51B2b is greater than area of the opening HB at or near the first end portion 51B2a. The area is gradually greater from the opening HB to the opening HA. Thus, a difference between luminance of the light-emitting layer 24A2 at or near the second end portion 51B2b and luminance of the light-emitting layer 24B2 at or near the first end portion 51B2a can be suppressed.

As a result, variation in luminance of each pixel PX can be suppressed in the display region as a whole.

Note that, in the display device 1B, a distance between the openings H and H adjacent to each other across the high-level power source line 51B1 or the high-level power source line 51B2 (a distance between the openings HA and HB) is constant along the high-level power source line 51B1 or the high-level power source line 51B2. That is, the distance between the openings H and H adjacent to each other across the high-level power source line 51B1 or the high-level power source line 51B2 (the distance between the openings HA and HB) is the same entirely in the display region.

FOURTH EMBODIMENT

A fourth embodiment of the disclosure will be described below. Note that, for the convenience of description, a member having the same function as the function of the member described in the first to third embodiments is denoted by the same reference sign, and description of such a member will be omitted.

Figure 7:
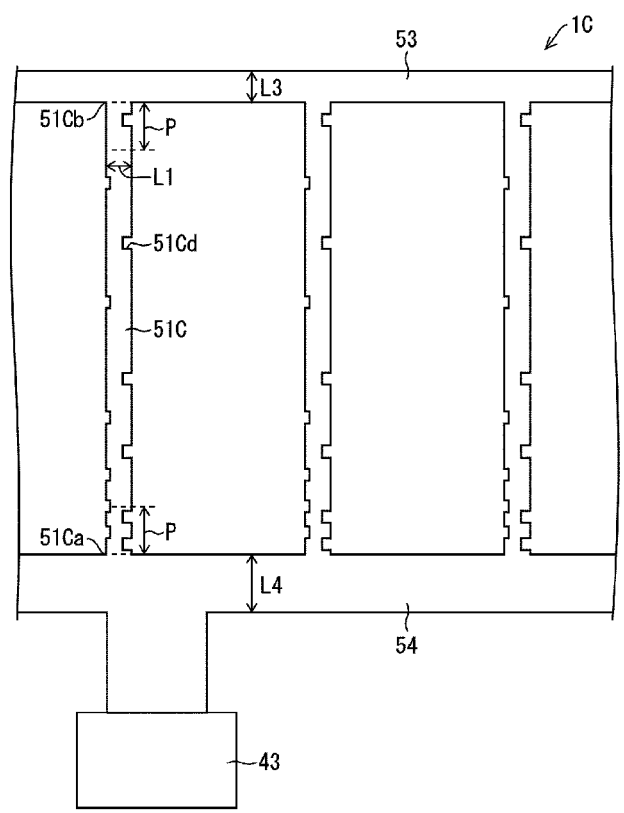
FIG. 7 is a view illustrating a configuration of a power source line of a display device according to a fourth embodiment of the disclosure.

FIG. 7 is a plan view illustrating a configuration of a high-level power source line 51C of a display device 1C according to a fourth embodiment of the disclosure. The display device 1 (FIG. 1 or the like) may include the high-level power source line 51C illustrated in FIG. 7 instead of the high-level power source line 51. Note that the display device 1C includes the same configuration as the configuration of the display device 1 except that the high-level power source line 51 is changed to the high-level power source line 51C in the display device 1.

The high-level power source line 51C has a width L1 that is constant from a first end portion 51Ca to a second end portion 51Cb, and a plurality of notches 51Cd that adjust a resistance value in at least a portion of a section ranging from the first end portion 51Ca to the second end portion 51Cb are formed in the high-level power source line 51C.

Area of each of the plurality of notches 51Cd provided per unit length P at or near the first end portion 51Ca of the high-level power source line 51C is greater than area of each of the plurality of notches 51Cd provided per unit length P at or near the second end portion 51Cb of the high-level power source line 51C. FIG. 7 illustrates an example where the area of each notch 51Cd when a substrate plane is viewed from the normal direction is the same, and the number of the notches 51Cd provided per unit length P at or near the first end portion 51Ca of the high-level power source line 51C is greater than the number of the notches 51Cd provided per unit length P at or near the second end portion 51Cb of the high-level power source line 51C.

Note that the area of the notch 51Cd provided per unit length P refers to decrement in area of the high-level power source line 51C per unit length P from area (P×L1) obtained assuming that the width of the unit length P of the high-level power source line 51C is the width L1 and is constant.

Accordingly, each high-level power source line 51C includes a configuration where area per unit length P at or near the first end portion 51Ca is smaller than area per unit length P at or near the second end portion 51Cb. Thus, each high-level power source line 51C has a resistance value per unit length P at or near the first end portion 51Ca that is greater than a resistance value per unit length P at or near the second end portion 51Cb. Accordingly, a value of the high-level power supply voltage ELVDD at or near the second end portion 51Cb can be prevented from becoming smaller than a value of the high-level power supply voltage ELVDD at or near the first end portion 51Ca.

Note that in each high-level power source line 51C, area of the notch 51Cd provided per unit length P in a section in the first end portion 51Ca side may be smaller than area of the notch 51Cd provided per unit length P in a section in the second end portion 51Cb side in the at least a portion of a section ranging from the first end portion 51Ca to the second end portion 51Cb.

In other words, the notches 51Cd are provided in each high-level power source line 51C, and thus area of the high-level power source line 51C per unit length P in the section in the first end portion 51Ca side may be smaller than area of the high-level power source line 51C per unit length P in the section in the second end portion 51Cb side.

The disclosure is not limited to each embodiment described above, and various modifications may be made within the scope of the claims. An embodiment obtained by appropriately combining the technical approaches disclosed in each of the different embodiments also falls within the technical scope of the disclosure. Further, a novel technical feature can be formed by combining the technical approaches disclosed in each of the embodiments.

The invention claimed is:

1. A display device including a display region where pixels are arrayed, each of the pixels including an electro-optical element comprising a pair of electrodes that includes a first electrode and a second electrode, the display device comprising:
   a power source circuit supplying a voltage to each of a plurality of first electrodes, including the first electrodes;
   a first power source bus line connected to the power source circuit, supplied with a constant voltage from the power source circuit, and extending along an edge of the display region;
   a second power source bus line facing the first power source bus line across from the display region; and
   a plurality of power source lines branched from the first power source bus line toward the display region and connected to the second power source bus line,
   wherein each of the plurality of power source lines includes a first end portion where the constant voltage is supplied from the power source circuit, and a second end portion opposite the first end portion, and
   a resistance value per unit length of each of the plurality of power source lines increases from the second end portion toward the first end portion in at least one portion of each of the plurality of power source lines between the first end portion and the second end portion.

2. The display device according to claim 1, wherein a width of the first power source bus line is greater than a width of the second power source bus line.

3. The display device according to claim 1, wherein a width of the second power source bus line is greater than a greatest width of each of the plurality of power source lines.

4. The display device according to claim 1, wherein the resistance value of each of the plurality of power source lines gradually increases from the second end portion toward the first end portion.

5. The display device according to claim 1, wherein an area per unit length of each of the plurality of power source lines decreases from the first end portion toward the second end portion in the at least one portion of each of the plurality of power source lines.

6. The display device according to claim 1, wherein a plurality of notches are formed in each of the plurality of power source lines.

7. The display device according to claim 6, wherein a width of the first power source bus line is greater than a width of the second power source bus line, and
the width of the second power source bus line is greater than a width of a region of each of the plurality of power source lines without the plurality of notches.

8. The display device according to claim 6, wherein an area of the plurality of notches per unit length of each of the plurality of power source lines increases from the first end portion toward the second end portion in the at least one portion of each of the plurality of power source lines.

9. The display device according to claim 1, wherein each of the plurality of power source lines is formed in a comb-like shape, the display device further comprises another power source circuit, another first power source bus line, another second power source bus lines, and another plurality of power source lines, and positions of a plurality of the first end portions and the second end portions of the power source circuit and positions of a plurality of first end portions and second end portions of the other plurality of power source lines adjacent to each other are reversed.

10. The display device according to claim 1, wherein the first electrode is provided for each of the pixels, and the second electrode is provided in common to the pixels,
the electro-optical element further includes a light-emitting layer provided for each of the pixels between the first electrode and the second electrode, an edge cover configured to cover an end portion of the first electrode and including an opening exposing the first electrode is provided in an upper layer of the first electrode, among pixels that are aligned adjacent to the at least one portion of each of the plurality of power source lines, an area of the opening in a pixel in the second end portion is greater than an area of the opening in a pixel in the first end portion, and the light-emitting layer in the pixel in the second end portion and the light-emitting layer in the pixel in the first end portion have a same shape and a same size.

11. A display device including a display region where pixels are arrayed, each of the pixels including an electro-optical element comprising a pair of electrodes that includes a first electrode and a second electrode, wherein the first electrode is provided for each of the pixels and the second electrode is provided in common to the pixels, the electro-optical element further includes a light-emitting layer provided for each of the pixels between the first electrode and the second electrode, and an edge cover, configured to cover an end portion of the first electrode and including an opening exposing the first electrode, is further provided in a layer above the first electrode, the display device comprising:
- a power source circuit supplying a voltage to each of a plurality of first electrodes, including the first electrode;
- a power source line connected to the power source circuit and supplied with a constant voltage from the power source circuit; and
- a pixel circuit disposed in each of the pixels, and including the electro-optical element, the first electrode and the second electrode, the pixel circuit supplied with the constant voltage from the power source line and configured to control a signal given to the first electrode, wherein each of a plurality of power source lines, including the power source line, extends along a direction in which the pixels are aligned, and includes a first end portion where the constant voltage is supplied from the power source circuit, and a second end portion opposite the first end portion, among the pixels aligned adjacent to at least one portion of each of the plurality of power source lines between the first end portion and the second end portion, an area of the opening in the pixel in the second end portion is greater than an area of the opening in the pixel in the first end portion, and the light-emitting layer in the pixel in the second end portion and the light-emitting layer in the pixel in the first end portion have a same shape and a same size.

12. The display device according to claim 11,
wherein an area of the opening gradually increases from the first end portion toward the second end portion.

13. The display device according to claim 1,
wherein in the plurality of power source lines, a plurality of the first end portions adjacent to each other is connected to each other.

14. The display device according to claim 1,
wherein in the plurality of power source lines, a plurality of the second end portions adjacent to each other is connected to each other.

15. The display device according to claim 1,
wherein the first electrode is formed in an island shape for each of the pixels,
the second electrode is continuously formed across the pixels, and
the second electrode is supplied with a constant voltage different from the constant voltage supplied from the power source circuit.

16. The display device according to claim 1,
wherein each of the pixels includes an organic EL element.

* * * * *